(12) United States Patent
Xiang

(10) Patent No.: US 12,205,876 B2
(45) Date of Patent: Jan. 21, 2025

(54) EMBEDDED PACKAGING STRUCTURE, PREPARATION METHOD THEREOF, AND TERMINAL DEVICE

(71) Applicant: HUAWEI TECHNOLOGIES CO., LTD., Shenzhen (CN)

(72) Inventor: Zhiqiang Xiang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 468 days.

(21) Appl. No.: 17/570,889

(22) Filed: Jan. 7, 2022

(65) Prior Publication Data

US 2022/0223510 A1 Jul. 14, 2022

(30) Foreign Application Priority Data

Jan. 12, 2021 (CN) .................. 202110035160.X

(51) Int. Cl.
*H01L 23/15* (2006.01)
*H01L 21/48* (2006.01)
*H01L 23/14* (2006.01)
*H01L 23/498* (2006.01)

(52) U.S. Cl.
CPC ...... *H01L 23/49827* (2013.01); *H01L 21/486* (2013.01); *H01L 23/147* (2013.01); *H01L 23/15* (2013.01)

(58) Field of Classification Search
CPC .................. H01L 23/49827; H01L 23/36
USPC .................................. 257/774, 713
See application file for complete search history.

(56) References Cited

U.S. PATENT DOCUMENTS

| | | | | |
|---|---|---|---|---|
| 6,084,297 A * | 7/2000 | Brooks | ............. | H01L 23/49816 257/E23.114 |
| 6,472,735 B2 * | 10/2002 | Isaak | ...................... | H05K 1/141 257/777 |
| 6,709,897 B2 * | 3/2004 | Cheng | ..................... | H01L 24/05 438/126 |
| 9,887,167 B1 * | 2/2018 | Lee | ..................... | H01L 21/4882 |
| 10,798,823 B2 * | 10/2020 | Iihola | ...................... | H01L 24/24 |
| 2002/0020898 A1 * | 2/2002 | Vu | ......................... | H01L 21/561 257/676 |

(Continued)

FOREIGN PATENT DOCUMENTS

| | | |
|---|---|---|
| CN | 101325188 A | 12/2008 |
| CN | 103413802 A | 11/2013 |

(Continued)

*Primary Examiner* — Nitin Parekh
(74) *Attorney, Agent, or Firm* — Rimon PC

(57) ABSTRACT

This application provides an embedded packaging structure, a preparation method thereof, and a terminal device. The embedded packaging structure includes a substrate frame, and a first through hole and a second through hole that run through the substrate frame in a thickness direction of the substrate frame. A metal connection electrode is disposed in the first through hole, an electronic component is embedded in the second through hole, and a pin of the electronic component is exposed at a hole opening of the second through hole. The substrate frame is made of silicon or a ceramic. Compared with a prior art substrate frame formed by using a resin material, the substrate frame in this application has better heat dissipation performance, moisture resistance, and strength in addition to providing insulation.

14 Claims, 8 Drawing Sheets

(56) References Cited

U.S. PATENT DOCUMENTS

| | | | |
|---|---|---|---|
| 2013/0032947 A1* | 2/2013 | Park | H01L 23/544 257/777 |
| 2019/0131241 A1* | 5/2019 | Jeng | H01L 25/105 |
| 2020/0161248 A1 | 5/2020 | Lee et al. | |
| 2020/0357749 A1 | 11/2020 | Chen et al. | |

FOREIGN PATENT DOCUMENTS

| | | |
|---|---|---|
| CN | 104576575 A | 4/2015 |
| CN | 105845643 A | 8/2016 |
| CN | 207995490 U | 10/2018 |
| CN | 109727969 A | 5/2019 |
| CN | 209641645 U | 11/2019 |
| CN | 110600440 A | 12/2019 |
| CN | 211607053 U | 9/2020 |
| CN | 112908943 A | 6/2021 |
| EP | 0218438 A2 | 4/1987 |
| EP | 1484797 A1 | 12/2004 |
| TW | 200620598 A | 6/2006 |
| WO | 2007130471 A2 | 11/2007 |

\* cited by examiner

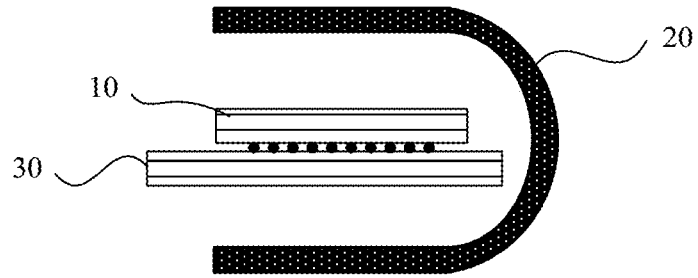

FIG. 1

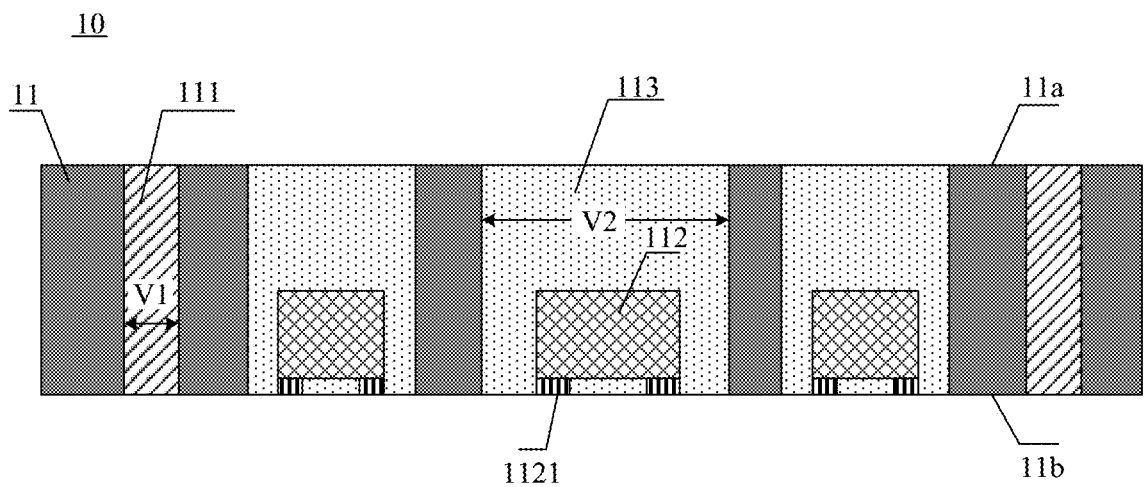

FIG. 2

| Form a substrate frame, where the substrate frame is made of silicon or ceramic, and the substrate frame is provided with a first through hole and a second through hole that run through the substrate frame along a thickness direction of the substrate frame | S301 |

| Form a metal connection electrode in the first through hole, and embed an electronic component in the second through hole, where a pin of the electronic component is exposed at a hole opening of the second through hole | S302 |

FIG. 3

EMBEDDED PACKAGING STRUCTURE, PREPARATION METHOD THEREOF, AND TERMINAL DEVICE

CROSS-REFERENCE TO RELATED APPLICATIONS

This application claims priority to Chinese Patent Application No. 202110035160.X, filed on Jan. 12, 2021, which is hereby incorporated by reference in its entirety.

TECHNICAL FIELD

This application relates to the field of electronic component packaging technologies, and in particular, to an embedded packaging structure, a preparation method thereof, and a terminal device.

BACKGROUND

With development of electronic products in a direction of miniaturization, portability, and multifunctionality, an embedded component packaging (ECP) technology has become a research hotspot in the field of electronic component packaging technologies. ECP is a packaging form in which electronic components such as a capacitor, a resistor, and a chip are embedded in a substrate. The embedded component packaging, which can shorten a link path between the components, reduces transmission losses, improves product integration, reduces an outer dimension of a module, and improves reliability and electro-thermal performance of a product, is an important means of achieving multifunctionality and high performance of portable electronic devices.

Currently, a substrate frame in the ECP includes a resin material or a resin material plus a metal layer. Because thermal conductivity performance of the resin material is poor, heat dissipation efficiency of an embedded electronic component is low. In addition, a water absorption rate of the resin material is high, and moisture absorption tends to weaken a bonding force at bonding interfaces between different materials, thereby causing delamination. In a scenario of high temperature and high humidity, ion migration is prone to occur at a delamination position of a component, causing a short circuit of the component.

SUMMARY

This application provides an embedded packaging structure, a preparation method thereof, and a terminal device to improve outward diffusion of internal heat and moisture resistance of the embedded packaging structure.

According to a first aspect, this application provides an embedded packaging structure, including: a substrate frame, and a first through hole and a second through hole that both run through the substrate frame in a thickness direction of the substrate frame. In other words, the substrate frame has an upper surface and a lower surface that are disposed oppositely, and both the first through hole and the second through hole run from the upper surface to the lower surface. A metal connection electrode is disposed in the first through hole, and the connection electrode can implement an interconnection between components located on the upper surface and the lower surface of the substrate frame. An electronic component is embedded in the second through hole, and a pin of the electronic component is exposed at a hole opening of the second through hole, so that a signal can be subsequently provided for the electronic component through the pin. The substrate frame is made of silicon or a ceramic, that is, the substrate frame is formed by using a silicon substrate or a ceramic substrate. Compared with a substrate frame formed by using a resin material in an existing technology, the substrate frame in this application has better heat dissipation performance, moisture resistance, and strength in addition to providing insulation. Reliability and an electrical characteristic of an ECP product can be significantly improved.

The embedded electronic component is not limited in this application. For example, the electronic component may be an active electronic component or a passive electronic component. When the electronic component is an active electronic component, the electronic component may be a die. A die is a crystal before packaging of the chip. Each die is one chip that has an independent function and that has not been packaged, and may include one or more circuits. The chip may have any number of different functions, such as a CPU chip, a radio frequency driving chip, or another chip of a processor. When the electronic component is a passive electronic component, the electronic component may be a capacitor C, a resistor R, an inductor, or the like.

Further, when the embedded electronic component is a die, the die is generally formed on a wafer. When materials of the substrate frame and the wafer of the die are the same, because main material properties of the substrate frame and the wafer of the die are the same, coefficients of thermal expansion (CTE) of the substrate frame and the wafer of the die match well, providing strong thermal shock resistance. Therefore, a probability of delamination of a bonding interface between the embedded electronic component and the substrate frame caused due to thermal shock when an ambient temperature changes sharply can be reduced.

It should be noted that quantities and sizes of first through holes and second through holes are not limited in this application, and need to be set based on a specific function of the embedded packaging structure. For example, the size of the second through hole may be set based on a size of the embedded electronic component that needs to be embedded, and the quantity of second through holes may be set based on a quantity of embedded electronic components.

To improve a heat dissipation capability of the embedded packaging structure, a heat dissipation hole is further formed in the substrate frame, where an extension direction of the heat dissipation hole is perpendicular to a thickness direction of the substrate frame, and the heat dissipation hole is not in communication with the first through hole or the second through hole. A specific size of the heat dissipation hole and a specific quantity of heat dissipation holes are designed based on a heat dissipation requirement. When air with a temperature lower than that of the substrate frame is controlled to flow through the heat dissipation hole, it is air-cooled heat dissipation. In this way, heat is taken away by the air flowing through the heat dissipation hole. When liquid with a temperature lower than that of the substrate frame is controlled to flow through the heat dissipation hole, it is liquid-cooled heat dissipation. In this way, heat is taken away by the liquid flowing through the heat dissipation hole.

In this application, the embedded packaging structure may further include: a first interconnection line layer located on a side of the substrate frame and located on a side on which the pin of the electronic component is exposed, where the first interconnection line layer is electrically connected to a terminal of the metal connection electrode and the pin of the electronic component. In the embedded packaging structure, the metal connection electrode in the substrate frame and the electronic component are interconnected by using the first interconnection line layer. The first interconnection line layer is directly disposed on the substrate frame, and compared with an existing technology, an insulation medium layer disposed between the first interconnection line layer and the substrate frame is not needed. Therefore, a thickness of the embedded packaging structure can be thinner, a structure and a process of the embedded packaging structure can be simplified, and manufacturing costs are reduced.

During specific implementation, the first interconnection line layer may include at least one conducting layer, and a circuit line is disposed on the conducting layer. When the first interconnection line layer includes two or more conducting layers, an insulation medium layer is further disposed between neighboring conducting layers. In this case, an aperture is provided through the insulation medium layer to connect circuit lines on different conducting layers.

For example, the first interconnection line layer may include only one conducting layer, and a circuit line on the conducting layer is separately electrically connected to a terminal of the metal connection electrode and the pin of the electronic component. Alternatively, the first interconnection line layer includes a first conducting layer, a second conducting layer, and an insulation medium layer located between the first conducting layer and the second conducting layer. A circuit line on the first conducting layer is separately electrically connected to a terminal of the metal connection electrode and the pin of the electronic component, and the circuit line on the first conducting layer is electrically connected to a circuit line on the second conducting layer through an aperture through the insulation medium layer.

It should be noted that a quantity of conducting layers included in the first interconnection line layer is not limited in this application, and may be designed based on an actual requirement.

Further, the embedded packaging structure may further include: a first insulation medium layer located between the first interconnection line layer and the substrate frame, where the first interconnection line layer is electrically connected to the terminal of the metal connection electrode and the pin of the electronic component through a via running through the first insulation medium layer. The first insulation medium layer is used as a stress buffer layer, so that a CTE gradient between the first interconnection line layer and the substrate frame decreases, thereby reducing a stress generated when the first interconnection line layer and the substrate frame are interconnected.

To implement an interconnection between the embedded packaging structure and an external component (for example, a printed circuit board (PCB) or another chip) or a substrate, the embedded packaging structure and the outside may be interconnected by using a pad. A position of the pad and a quantity of pads need to be set based on a connection requirement of the embedded packaging structure to the outside. For example, the embedded packaging structure may further include a first solder mask layer and a plurality of first pads. The first solder mask layer is located on a side of the first interconnection line layer facing away from the substrate frame, and the first solder mask layer is provided with openings configured to expose a part of an area of the first interconnection line layer. The first pads are located in the openings of the first solder mask layer, and the first pads are electrically connected to the first interconnection line layer exposed by the openings of the first solder mask layer. In this way, the embedded packaging structure and the external component or the substrate are interconnected by using the first pads. Positions of the first pads may be re-arranged on the first interconnection line layer, to arrange the first pads to an area with a wider pitch. The first solder mask layer may prevent a short circuit between the first pads.

In this application, only one side of the substrate frame may be provided with a line layer and a pad. Alternatively, each of the two sides of the substrate frame may be provided with a line layer and a pad, so that the two sides of the substrate frame may be interconnected to the external component or the substrate, and the two sides of the substrate frame may be interconnected by using the metal connection electrode.

Optionally, the embedded packaging structure may further include: a second interconnection line layer located on a side of the substrate frame facing away from the first interconnection line layer, where the second interconnection line layer is electrically connected to another terminal of the metal connection electrode. That is, the two sides of the embedded packaging structure may be interconnected to the external component or the substrate by using the first interconnection line layer and the second interconnection line layer, and the first interconnection line layer and the second interconnection line layer may be interconnected by using the metal connection electrode. In addition, the second interconnection line layer is directly disposed on the substrate frame, and compared with an existing technology, an insulation medium layer disposed between the second interconnection line layer and the substrate frame is not needed. Therefore, a thickness of the embedded packaging structure can be thinner, a structure and a process of the embedded packaging structure can be simplified, and manufacturing costs are reduced.

During specific implementation, the second interconnection line layer may include at least one conducting layer, and a circuit line is disposed on the conducting layer. When the second interconnection line layer includes two or more conducting layers, an insulation medium layer is further disposed between neighboring conducting layers. In this case, an aperture is provided through the insulation medium layer to connect circuit lines on different conducting layers.

For example, the second interconnection line layer may include only one conducting layer, and a circuit line on the conducting layer is electrically connected to another terminal of the metal connection electrode. Alternatively, the second interconnection line layer includes a third conducting layer, a fourth conducting layer, and an insulation medium layer located between the third conducting layer and the fourth conducting layer. A circuit line on the third conducting layer is electrically connected to another terminal of the metal connection electrode, and the circuit line on the third conducting layer is electrically connected to a circuit line on the fourth conducting layer through an aperture through the insulation medium layer.

It should be noted that a quantity of conducting layers included in the second interconnection line layer is not limited in this application, and may be designed based on an actual requirement.

Further, the embedded packaging structure may further include: a second insulation medium layer located between the second interconnection line layer and the substrate frame, where the second interconnection line layer is electrically connected to another terminal of the metal connection electrode through a via running through the second insulation medium layer. The second insulation medium layer is used as a stress buffer layer, so that a CTE gradient between the second interconnection line layer and the substrate frame decreases, thereby reducing a stress generated when the second interconnection line layer and the substrate frame are interconnected.

Optionally, the embedded packaging structure may further include a second solder mask layer and a plurality of second pads. The second solder mask layer is located on a side of the second interconnection line layer facing away from the substrate frame, and the second solder mask layer is provided with openings configured to expose a part of an area of the second interconnection line layer. The second pads are located in the openings of the second solder mask layer, and the second pads are electrically connected to the second interconnection line layer exposed by the openings of the second solder mask layer. In this way, the embedded packaging structure and the external component or the substrate are interconnected by using the second pads. Positions of the second pads may be re-arranged on the second interconnection line layer, to arrange the second pads to an area with a wider pitch. The second solder mask layer may prevent a short circuit between the second pads.

In this application, the metal connection electrode located in the first through hole is generally a copper electrode. This is not limited herein.

Optionally, the insulation medium layer may be made of silicon oxide, nitride oxide, epoxy resin, or the like. Materials employed for the insulation medium layers at different positions may be the same or may be different. This is not limited herein.

During actual preparation, the solder mask layer may be a layer structure prepared from ceramic or high-temperature glass material, and the conducting layer may be a layer structure prepared from any conductive material such as gold, silver, copper, or the like. This is not limited herein.

During specific implementation, in this application, a chip unit integrated on one side of the substrate frame may further be included. That is, the chip unit and the substrate frame are integrated, so that the embedded packaging structure can be formed integrally by using an existing semiconductor wafer process technology and an existing equipment resource to reduce production costs.

The chip unit usually refers to the foregoing die, and includes a semiconductor material and a circuit layer arranged on the semiconductor material. A semiconductor component such as a transistor is formed on the semiconductor material. A plurality of layers of circuits are disposed in a circuit layer, and various functional circuits are generally disposed. These circuits are coupled to the semiconductor component on the semiconductor material to form a complete chip circuit structure. A surface on a side on which the circuit layer in the chip is located is referred to as an active surface, and a surface on a side (the side opposite to the active surface) on which the semiconductor material in the chip is located is referred to as a passive surface.

In this application, the chip unit may be located on an upper surface of the substrate frame, that is, disposed on a side of the substrate frame facing the first interconnection line layer; or may be located on a lower surface of the substrate frame, that is, disposed on a side of the substrate frame facing the second interconnection line layer. This is not limited herein. A difference between the chip unit and the embedded die lies in that the substrate frame is reused as a wafer of the chip unit, and the embedded die is formed by cutting after preparation on an additional wafer. The wafer of the embedded die and the substrate frame are not the same wafer.

According to a second aspect, this application provides a terminal device, including: a housing, a main board disposed in the housing, and an embedded packaging structure disposed on the main board, where the embedded packaging structure is the embedded packaging structure provided in any one of the foregoing embodiments of this application. Because the embedded packaging structure has the technical effect in the first aspect, the terminal device including the embedded packaging structure also has better heat dissipation performance, moisture resistance, and strength. Reliability and an electrical characteristic of an ECP product can be significantly improved.

According to a third aspect, this application further provides a preparation method for an embedded packaging structure, including: first, forming a substrate frame, where the substrate frame is made of silicon or a ceramic, and the substrate frame is provided with a first through hole and a second through hole that run through the substrate frame along a thickness direction of the substrate frame; and then, forming a metal connection electrode in the first through hole, and embedding an electronic component in the second through hole, where a pin of the electronic component is exposed at a hole opening of the second through hole, and the electronic component is an active electronic component or a passive electronic component.

It may be understood that a sequence of forming the metal connection electrode and embedding the electronic component is not limited in this application. The metal connection electrode may be formed first in the first through hole, and then the electronic component is embedded in the second through hole. Certainly, the electronic component may alternatively be embedded first in the second through hole, and then the metal connection electrode is formed in the first through hole.

An example in which the substrate frame is made of silicon is used. The first through hole and the second through hole may be formed first on a wafer by using a through silicon via (TSV) process; then, the metal connection electrode is formed in the first through hole; and subsequently, the electronic component is embedded in the second through hole. Alternatively, the first through hole and the second through hole may be formed first on a wafer by using a through silicon via (TSV) process; then, the electronic component is embedded in the second through hole; and subsequently, the metal connection electrode is formed in the first through hole.

During specific implementation, the electronic component may be embedded in the second through hole by using a resin material. For example, the electronic component may be placed in the second through hole first, and then the second through hole is filled with the resin material, so that the electronic component is embedded in the second through hole and the pin of the electronic component is exposed on a surface of the resin material.

In a possible implementation, after forming the metal connection electrode in the first through hole, and embedding the electronic component in the second through hole, the method may further include: forming a first interconnection line layer on a side of the substrate frame and on a side on which the pin of the electronic component is exposed, where the first interconnection line layer is electrically connected to a terminal of the metal connection electrode and the pin of the electronic component. In the embedded packaging structure, the metal connection electrode in the substrate frame and the electronic component are interconnected by using the first interconnection line layer. The first interconnection line layer is directly disposed on the substrate frame, and compared with an existing technology, an insulation medium layer disposed between the first interconnection line layer and the substrate frame is not needed. Therefore, a thickness of the embedded packaging structure can be thinner, a structure and a process of the embedded packaging structure can be simplified, and manufacturing costs can be reduced.

Further, after forming the metal connection electrode in the first through hole, and embedding the electronic component in the second through hole, and before forming the first interconnection line layer, the method may further include: forming a first insulation medium layer between the substrate frame and the to-be-formed first interconnection line layer, so that the to-be-formed first interconnection line layer is electrically connected to the terminal of the metal connection electrode and the pin of the electronic component through a via running through the first insulation medium layer.

To implement an interconnection between the embedded packaging structure and an external component (for example, a printed circuit board (printed circuit board, PCB) or another chip) or a substrate, the embedded packaging structure and the outside may be interconnected by using a pad (pad). A position of the pad and a quantity of pads need to be set based on a connection requirement of the embedded packaging structure to the outside.

Therefore, in this application, after forming the first interconnection line layer, the method may further include: forming a first solder mask layer on a side of the first interconnection line layer facing away from the substrate frame, where the first solder mask layer is provided with an opening configured to expose a part of area of the first interconnection line layer; and forming a first pad in the opening of the first solder mask layer, where the first pad is electrically connected to the first interconnection line layer exposed by the opening of the first solder mask layer.

In a possible implementation, in this application, after forming the metal connection electrode in the first through hole, and embedding the electronic component in the second through hole, the method may further include: forming a second interconnection line layer on a side of the substrate frame facing away from the first interconnection line layer, where the second interconnection line layer is electrically connected to another terminal of the metal connection electrode. That is, the two sides of the embedded packaging structure may be interconnected to the external component or the substrate by using the first interconnection line layer and the second interconnection line layer, and the first interconnection line layer and the second interconnection line layer may be interconnected by using the metal connection electrode. In addition, the second interconnection line layer is directly disposed on the substrate frame, and compared with an existing technology, an insulation medium layer disposed between the second interconnection line layer and the substrate frame is not needed. Therefore, a thickness of the embedded packaging structure can be thinner, a structure and a process of the embedded packaging structure can be simplified, and manufacturing costs can be reduced.

In a possible implementation, after forming the metal connection electrode in the first through hole, and embedding the electronic component in the second through hole, and before forming the second interconnection line layer, the method may further include: forming a second insulation medium layer between the substrate frame and the to-be-formed second interconnection line layer, so that the to-be-formed second interconnection line layer is electrically connected to the other terminal of the metal connection electrode through a via running through the second insulation medium layer. The second insulation medium layer is used as a stress buffer layer, so that a CTE gradient between the second interconnection line layer and the substrate frame is reduced, thereby reducing a stress generated when the second interconnection line layer and the substrate frame are interconnected.

Further, in this application, after forming a first interconnection line layer, the method may further include: forming a second solder mask layer on a side of the second interconnection line layer facing away from the substrate frame, where the second solder mask layer is provided with an opening configured to expose a part of an area of the second interconnection line layer; and forming a second pad in the opening of the second solder mask layer, where the second pad is electrically connected to the second interconnection line layer exposed by the opening of the second solder mask layer.

During specific implementation, in this application, the method may further include: forming a chip unit on one side of the substrate frame. That is, the chip unit and the substrate frame are integrated, so that the embedded packaging structure can be formed integrally by using an existing semiconductor wafer process technology and an existing equipment resource to reduce production costs.

During actual production, the chip unit may be formed before the electronic component is embedded, or the chip unit may be formed after the electronic component is embedded. This is not limited herein.

To improve a heat dissipation capability of the embedded packaging structure, in a possible implementation, the method in this application may further include: forming a heat dissipation hole in the substrate frame, where an extension direction of the heat dissipation hole is perpendicular to a thickness direction of the substrate frame, and the heat dissipation hole is not in communication with the first through hole or the second through hole.

It should be noted that a sequence of forming the heat dissipation hole in the substrate frame is not limited in this application. The heat dissipation hole may be formed at any time before the embedded packaging structure is formed, for example, it may be formed before or after the first through hole and the second through hole are formed; it may be formed before or after the metal connection electrode is formed; or it may be formed before or after the electronic component is embedded.

BRIEF DESCRIPTION OF DRAWINGS

FIG. 1 is a schematic diagram of a possible application scenario according to an embodiment of this application;

FIG. 2 is a schematic diagram of a structure of an embedded packaging structure according to an embodiment of this application;

FIG. 3 is a schematic flowchart of a preparation method for an embedded packaging structure according to an embodiment of this application;

DESCRIPTION OF EMBODIMENTS

Figure 4:
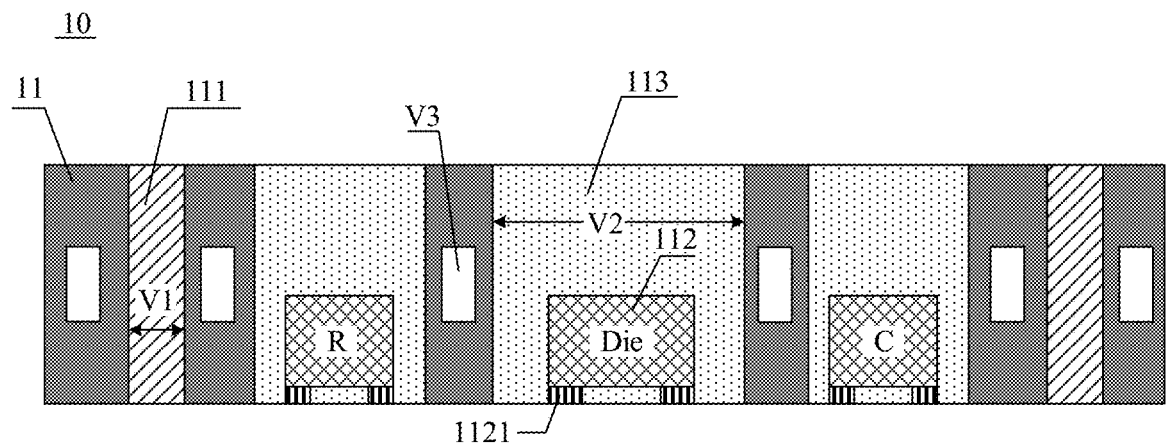
FIG. 4 is a schematic diagram of a structure of an embedded packaging structure according to another embodiment of this application.

To make objectives, technical solutions, and advantages of this application more clear, the following further describes this application in detail with reference to the accompanying drawings.

Terms used in the following embodiments of this application are merely intended to describe specific embodiments, but are not intended to limit this application. The terms "one", "a" and "this" of singular forms used in this specification and the appended claims of this application are also intended to include expressions such as "one or more", unless otherwise specified in the context clearly.

Reference to "one embodiment" or "some embodiments" described in this specification or the like means that one or more embodiments of this application include a particular feature, structure, or characteristic described in combination with the embodiment. Thus, phrases "in one embodiment", "in some embodiments", "in some other embodiments", "in some additional embodiments", and the like that appear in different parts in this specification do not necessarily mean referring to a same embodiment, but mean "one or more embodiments, but not all embodiments", unless otherwise specifically emphasized. The terms "include", "comprise", "have", and their variants all mean "include but are not limited to", unless otherwise specifically emphasized.

In addition, same reference numerals in the figures represent same or similar structures. Therefore, repeated description thereof is omitted. Expressions of positions and directions described in this application are described by using the accompanying drawings as examples. However, changes may be made as required, and the changes fall within the protection scope of this application. The accompanying drawings in this application are merely used to illustrate a relative position relationship and do not represent a true scale.

The embedded packaging structure provided in the embodiments of this application may be applied to various terminal devices, for example, may be applied to terminal devices such as a smartphone, a smart TV, a smart TV set top box, a personal computer (PC), a wearable device, and a smart broadband. It should be noted that the embedded packaging structure provided in the embodiments of this application is intended to include, but is not limited to, application to these and any other suitable type of terminal devices. As shown in FIG. 1, a mobile phone is used as an example. The terminal device includes a housing 20 and a printed circuit board disposed in the housing 20. The printed circuit board is provided with an embedded packaging structure 10. The printed circuit board may be a main board 30 of the terminal device, and the embedded packaging structure 10 is electrically connected to the main board 30.

FIG. 2 is a schematic diagram of a structure of an example of an embedded packaging structure 10 according to an embodiment of this application. Referring to FIG. 2, the embedded packaging structure may include: a substrate frame 11, and a first through hole V1 and a second through hole V2 that run through the substrate frame 11 along a thickness direction of the substrate frame 11. In other words, the substrate frame 11 has an upper surface 11$a$ and a lower surface 11$b$ that are oppositely disposed, and both the first through hole V1 and the second through hole V2 run from the upper surface 11$a$ to the lower surface 11$b$. A metal connection electrode 111 is disposed in the first through hole V1, and the connection electrode 111 provides an interconnection between components located on the upper surface 11$a$ and the lower surface 11$b$ of the substrate frame 11. An electronic component 112 is embedded in the second through hole V2, and a pin 1121 of the electronic component 112 is exposed at a hole opening of the second through hole V2, so that a signal can be subsequently provided for the electronic component 112 through the pin 1121. The substrate frame 11 is made of silicon or a ceramic, that is, the substrate frame 11 is formed by using a silicon substrate or a ceramic substrate. Compared with a substrate frame 11 formed by using a resin material in an existing technology, the substrate frame 11 in this application has better heat dissipation performance, moisture resistance, and strength in addition to providing insulation. Reliability and an electrical characteristic of an ECP product can be significantly improved.

FIG. 3 is a schematic flowchart of an example of a preparation method for an embedded packaging structure according to an embodiment of this application. Referring to FIG. 3, the preparation method mainly includes the following steps.

S301: Form a substrate frame, where the substrate frame is made of silicon or a ceramic, and the substrate frame is provided with a first through hole and a second through hole that run through the substrate frame along a thickness direction of the substrate frame.

S302: Form a metal connection electrode in the first through hole, and embed an electronic component in the second through hole, where a pin of the electronic component is exposed at a hole opening of the second through hole.

It may be understood that a sequence of forming the metal connection electrode and embedding the electronic component is not limited in this application. The metal connection electrode may be formed first in the first through hole, and then the electronic component is embedded in the second through hole. Alternatively, the electronic component may be embedded first in the second through hole, and then the metal connection electrode is formed in the first through hole.

An example in which the substrate frame is made of silicon is used. The first through hole and the second through hole may be formed first on a wafer by using a through silicon via (TSV) process; then, the metal connection electrode is formed in the first through hole; and subsequently, the electronic component is embedded in the second through hole. Alternatively, the first through hole and the second through hole may be formed first on a wafer by using a through silicon via (TSV) process; then, the electronic component is embedded in the second through hole; and subsequently, the metal connection electrode is formed in the first through hole.

During specific implementation, the electronic component may be embedded in the second through hole by using a resin material. For example, as shown in FIG. 2, the electronic component 112 may be placed in the second through hole V2 first, and then the second through hole V2 is filled with the resin material 113, so that the electronic component 112 is embedded in the second through hole V2 and the pin 1121 of the electronic component 112 is exposed on a surface of the resin material 113.

The embedded electronic component is not limited in this application. For example, the electronic component may be an active electronic component or a passive electronic component. When the electronic component 112 is an active electronic component, the electronic component 112 may be a die shown in FIG. 4. A die is a crystal before packaging of the chip. Each die is one chip that has an independent function and that has not been packaged, and may include one or more circuits. The chip may be chips with different functions, such as a CPU chip, a radio frequency driving chip, or another chip of a processor. When the electronic component 112 is a passive electronic component, the electronic component 112 may be a capacitor C, a resistor R, an inductor, or the like shown in FIG. 4.

Further, when the embedded electronic component is a die, the die is generally formed on a wafer. When materials of the substrate frame and the wafer of the die are the same, because the main material properties of the substrate frame and the wafer of the die are the same, coefficients of thermal expansion (CTE) of the substrate frame and the wafer of the die match well, and thermal shock resistance is strong. Therefore, a probability of delamination of a bonding interface between the embedded electronic component and the substrate frame caused due to thermal shock when an ambient temperature changes sharply can be reduced.

It should be noted that quantities and sizes of first through holes and second through holes are not limited in this application, and need to be set based on a specific function of the embedded packaging structure. For example, the size of the second through hole may be set based on a size of the embedded electronic component that needs to be embedded, and the quantity of second through holes may be set based on a quantity of embedded electronic components.

To improve a heat dissipation capability of the embedded packaging structure, as shown in FIG. 4, a heat dissipation hole V3 is further formed in the substrate frame 11, where an extension direction of the heat dissipation hole V3 is perpendicular to a thickness direction of the substrate frame 11, and the heat dissipation hole V3 is not communicated with the first through hole V1 or the second through hole V2. A specific size of the heat dissipation hole V3 and a specific quantity of heat dissipation holes V3 are designed based on a heat dissipation requirement. When air with a temperature lower than that of the substrate frame 11 is controlled to flow through the heat dissipation hole V3, it is air-cooled heat dissipation. In this way, heat is taken away by the air flowing through the heat dissipation hole V3. When liquid with a temperature lower than that of the substrate frame 11 is controlled to flow through the heat dissipation hole V3, it is liquid-cooled heat dissipation. In this way, heat is taken away by the liquid flowing through the heat dissipation hole V3.

It should be noted that a sequence of forming the heat dissipation hole in the substrate frame is not limited in this application. The heat dissipation hole may be formed at any time before the embedded packaging structure is formed, for example, may be formed before or after the first through hole and the second through hole are formed; may be formed before or after the metal connection electrode is formed; or may be formed before or after the electronic component is embedded.

Figure 5:
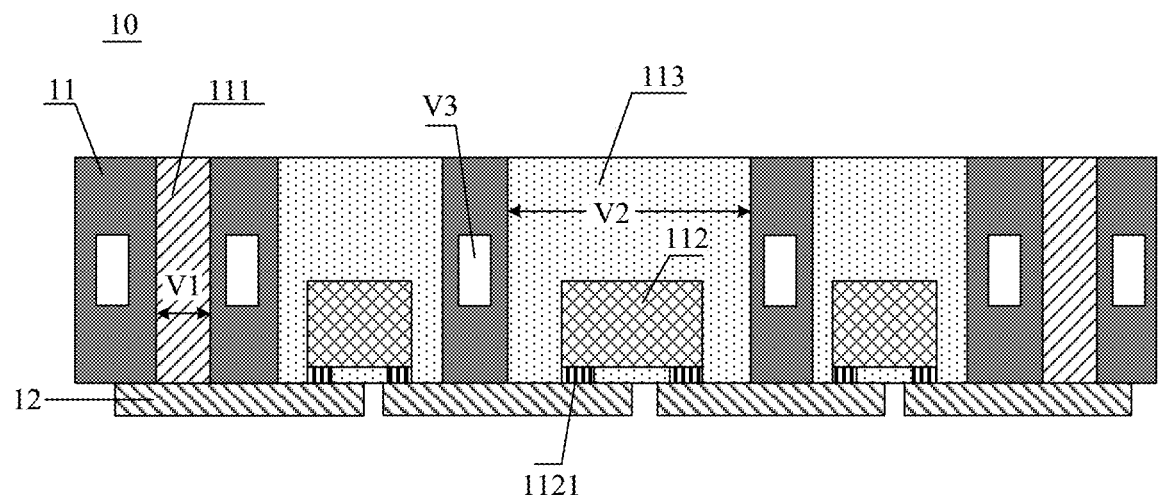
FIG. 5 is a schematic diagram of a structure of an embedded packaging structure according to another embodiment of this application.
Figure 6:
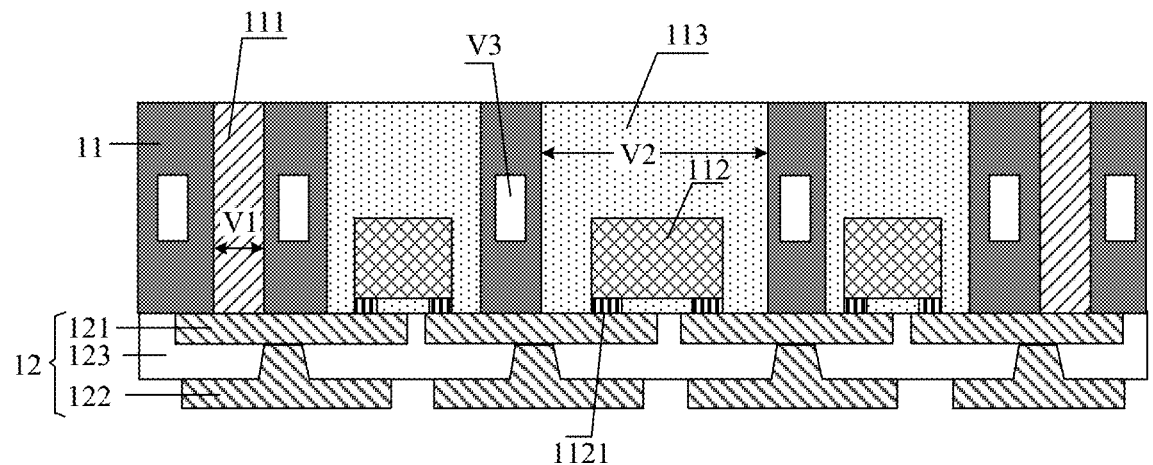
FIG. 6 is a schematic diagram of a structure of an embedded packaging structure according to another embodiment of this application.

Refer to FIG. 5 and FIG. 6, in this application, after forming a metal connection electrode 111 in the first through hole V1, and embedding the electronic component 112 in the second through hole V2, the method may further include: forming a first interconnection line layer 12 on a side of the substrate frame 11 and on a side on which the pin 1121 of the electronic component 112 is exposed, where the first interconnection line layer 12 is electrically connected to a terminal of the metal connection electrode 111 and the pin 1121 of the electronic component 112. In the embedded packaging structure 10, the metal connection electrode 111 in the substrate frame 11 and the electronic component 112 are interconnected by using the first interconnection line layer 12. The first interconnection line layer 12 is directly disposed on the substrate frame 11, and compared with an existing technology, an insulation medium layer disposed between the first interconnection line layer 12 and the substrate frame 11 is not needed. Therefore, a thickness of the embedded packaging structure 10 can be thinner, a structure and a process of the embedded packaging structure 10 can be simplified, and manufacturing costs can be reduced.

During specific implementation, the first interconnection line layer may include at least one conducting layer, and a circuit line is disposed on the conducting layer. When the first interconnection line layer includes two or more conducting layers, an insulation medium layer is further disposed between neighboring conducting layers. In this case, an aperture is provided through the insulation medium layer to connect circuit lines on different conducting layers.

For example, as shown in FIG. 5, the first interconnection line layer 12 includes only one conducting layer, and a circuit line on the conducting layer is separately electrically connected to a terminal of the metal connection electrode 111 and the pin 1121 of the electronic component 112. Alternatively, as shown in FIG. 6, the first interconnection line layer 12 includes a first conducting layer 121, a second conducting layer 122, and an insulation medium layer 123 located between the first conducting layer 121 and the second conducting layer 122. A circuit line on the first conducting layer 121 is separately electrically connected to a terminal of the metal connection electrode 111 and the pin 1121 of the electronic component 112, and the circuit line on the first conducting layer 121 is electrically connected to a circuit line on the second conducting layer 122 through an aperture through the insulation medium layer 123.

It should be noted that a quantity of conducting layers included in the first interconnection line layer is not limited in this application, and may be designed based on an actual requirement. FIG. 5 and FIG. 6 are illustrated only by using an example in which the first interconnection line layer includes one conducting layer or two conducting layers.

Further, after forming the metal connection electrode in the first through hole, and embedding the electronic component in the second through hole, and before forming the first interconnection line layer, the method further includes: forming a first insulation medium layer between the substrate frame and the to-be-formed first interconnection line layer, so that the to-be-formed first interconnection line layer is electrically connected to the terminal of the metal connection electrode and the pin of the electronic component through a via running through the first insulation medium layer.

Figure 9:
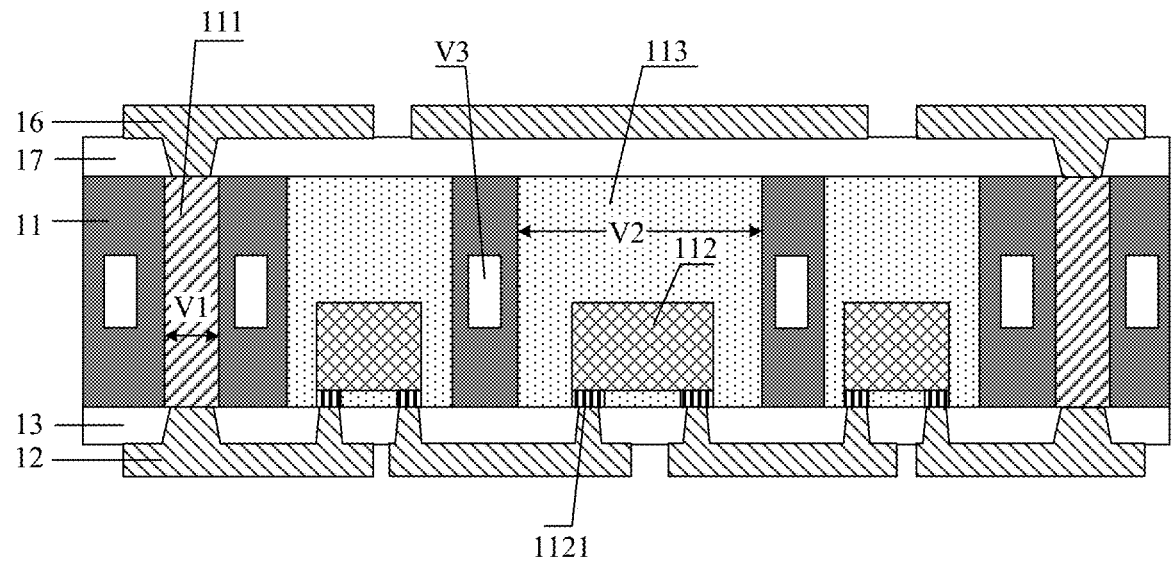
FIG. 9 is a schematic diagram of a structure of an embedded packaging structure according to another embodiment of this application.
Figure 10:
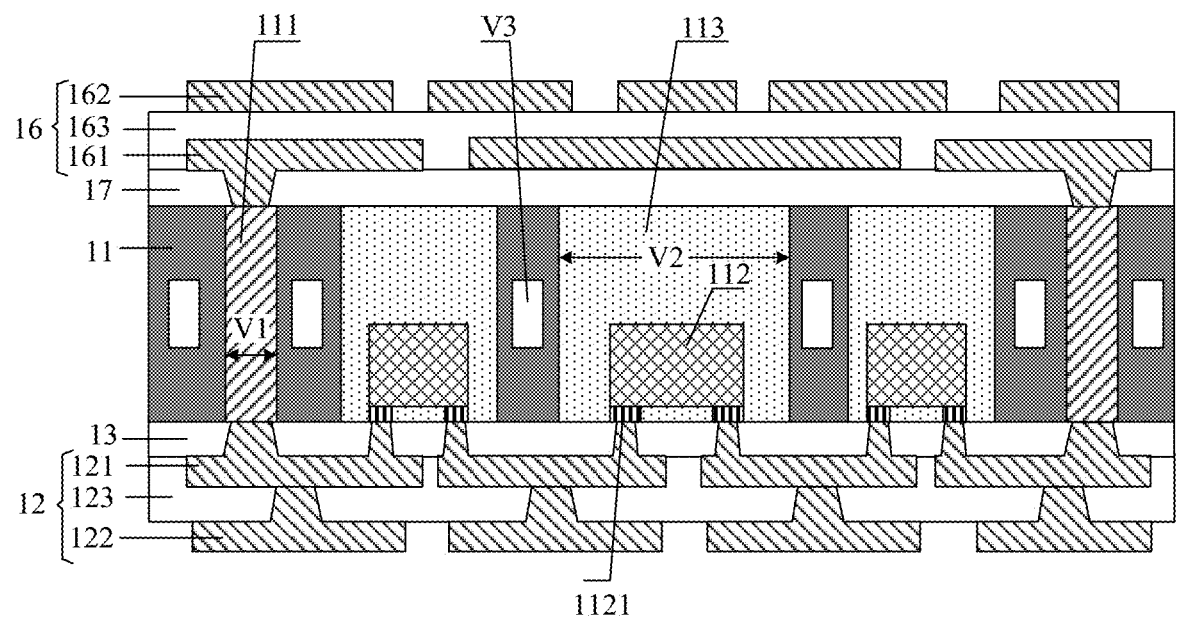
FIG. 10 is a schematic diagram of a structure of an embedded packaging structure according to another embodiment of this application.
Figure 11:
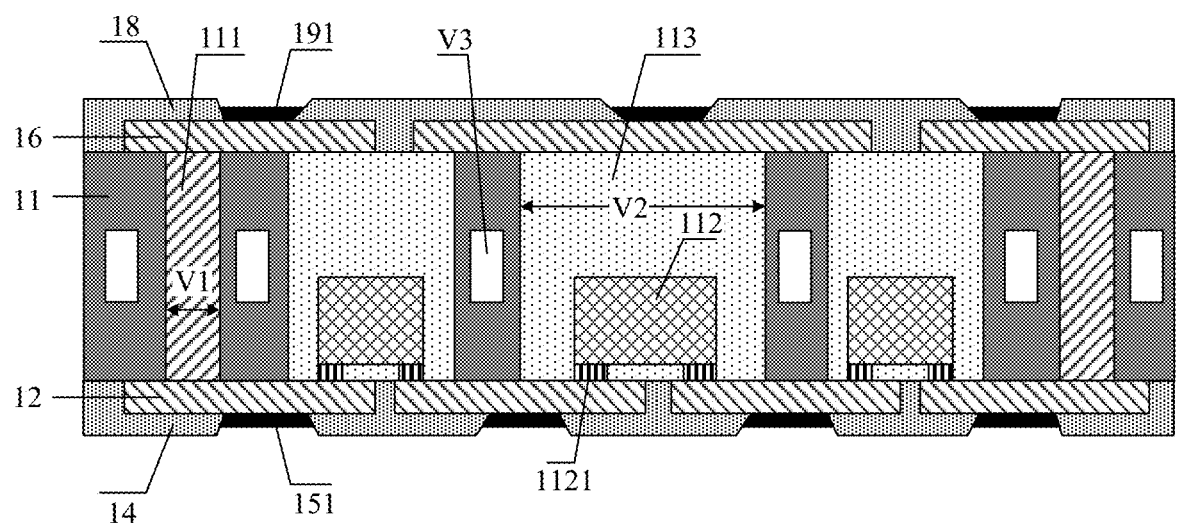
FIG. 11 is a schematic diagram of a structure of an embedded packaging structure according to another embodiment of this application.
Figure 12:
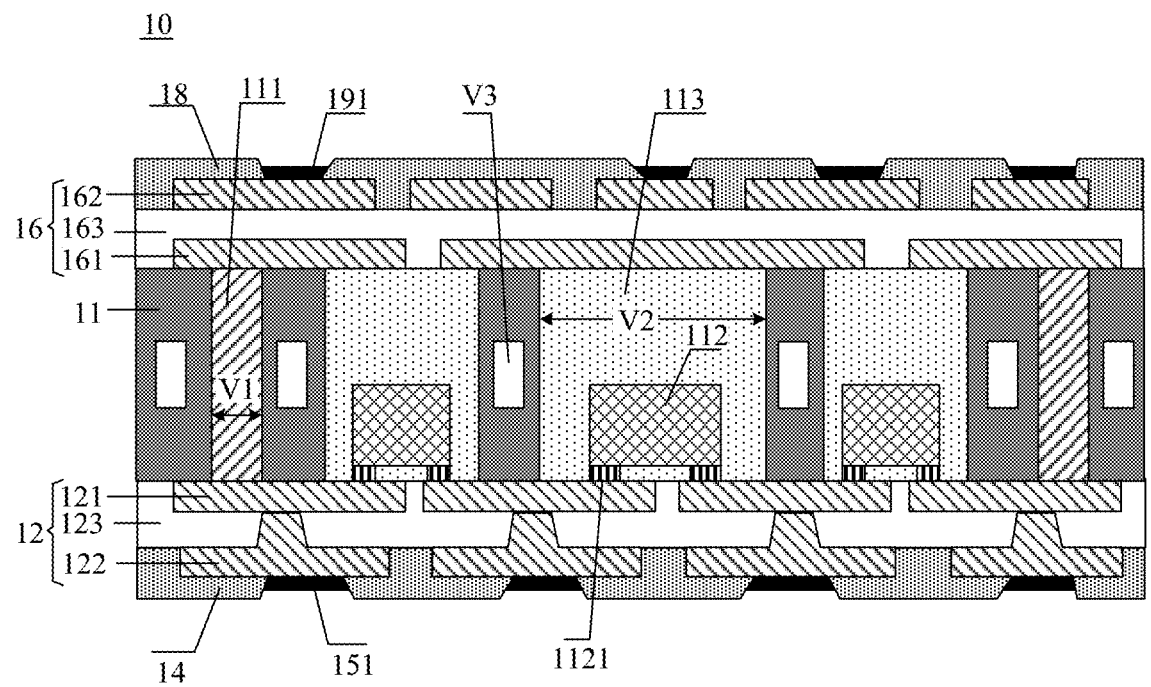
FIG. 12 is a schematic diagram of a structure of an embedded packaging structure according to another embodiment of this application.
Figure 13:
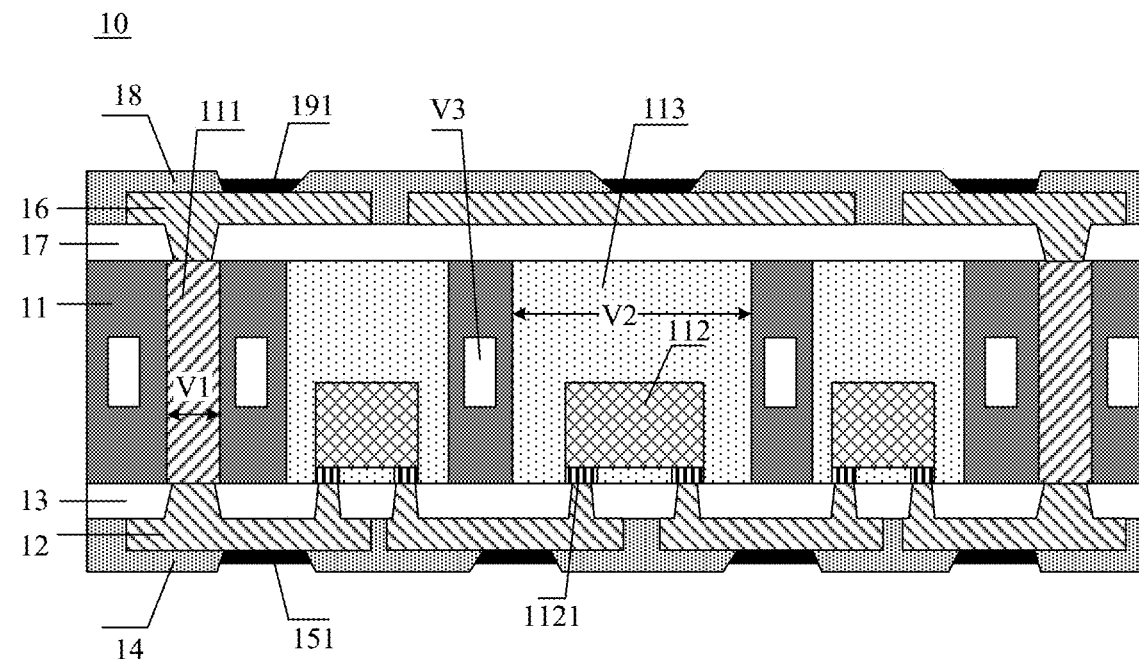
FIG. 13 is a schematic diagram of a structure of an embedded packaging structure according to another embodiment of this application.

For example, as shown in FIG. 9 and FIG. 10, the embedded packaging structure 10 may further include: a first insulation medium layer 13 located between the first interconnection line layer 12 and the substrate frame 11, where the first interconnection line layer 12 is electrically connected to the terminal of the metal connection electrode 111 and the pin 1121 of the electronic component 112 through a via running through the first insulation medium layer 13. The first insulation medium layer 13 is used as a stress buffer layer, so that a CTE gradient between the first interconnection line layer 12 and the substrate frame 11 decreases, thereby reducing a stress generated when the first interconnection line layer 12 and the substrate frame 11 are interconnected.

It should be noted that a circuit line on the first interconnection line layer 11 closest to a conducting layer of the substrate frame 11 is electrically connected to a terminal of the metal connection electrode 111 and the pin 1121 of the electronic component 112 through a via running through the first insulation medium layer 13. For example, in FIG. 10, a circuit line on the first conducting layer 121 is electrically connected to a terminal of the metal connection electrode 111 and the pin 1121 of the electronic component 112 through the via running through the first insulation medium layer 13, and a circuit line on the second conducting layer 122 is electrically connected to the circuit line on the first conducting layer 121 through the aperture through the insulation medium layer 123.

To implement an interconnection between the embedded packaging structure and an external component (for example, a printed circuit board (PCB) or another chip) or a substrate, the embedded packaging structure and the outside may be interconnected by using a pad. A position of the pad and a quantity of pads need to be set based on a connection requirement of the embedded packaging structure to the outside.

Therefore, in this application, after forming a first interconnection line layer, the method may further include: forming a first solder mask layer on a side of the first interconnection line layer facing away from the substrate frame, where the first solder mask layer is provided with an opening configured to expose a part of an area of the first interconnection line layer; and forming a first pad in the opening of the first solder mask layer, where the first pad is electrically connected to the first interconnection line layer exposed by the opening of the first solder mask layer.

For example, as shown in FIG. 11 to FIG. 14, the embedded packaging structure 10 may further include a first solder mask layer 14 and a plurality of first pads 151. The first solder mask layer 14 is located on a side of the first interconnection line layer 12 facing away from the substrate frame 11, and the first solder mask layer 14 is provided with openings configured to expose a part of an area of the first interconnection line layer 12. The first pads 151 are located in the openings of the first solder mask layer 14, and the first pads 151 are electrically connected to the first interconnection line layer 12 exposed by the openings of the first solder mask layer 14. In this way, the embedded packaging structure 10 and the external component or the substrate are interconnected by using the first pads 151. Positions of the first pads may be re-arranged on the first interconnection line layer 12, to arrange the first pads to an area with a wider pitch. The first solder mask layer 14 may prevent a short circuit between the first pads 151.

In this application, only one side of the substrate frame may be provided with a line layer and a pad. Alternatively, each of the two sides of the substrate frame may be provided with a line layer and a pad, so that the two sides of the substrate frame may be interconnected to the external component or the substrate, and the two sides of the substrate frame may be interconnected by using the metal connection electrode.

In this application, after forming the metal connection electrode 111 in the first through hole V1, and embedding the electronic component 112 in the second through hole V2, the method may further include: forming a second interconnection line layer 16 on a side of the substrate frame 11 facing away from the first interconnection line layer 12, where the second interconnection line layer 16 is electrically connected to another terminal of the metal connection electrode 111. That is, the two sides of the embedded packaging structure 10 may be interconnected to the external component or the substrate by using the first interconnection line layer 12 and the second interconnection line layer 16, and the first interconnection line layer 12 and the second interconnection line layer 16 may be interconnected by using the metal connection electrode 111. In addition, the second interconnection line layer 16 is directly disposed on the substrate frame 11, and compared with an existing technology, an insulation medium layer disposed between the second interconnection line layer 16 and the substrate frame 11 is not needed. Therefore, a thickness of the embedded packaging structure 10 can be thinner, a structure and a process of the embedded packaging structure 10 can be simplified, and manufacturing costs are reduced.

During specific implementation, the second interconnection line layer may include at least one conducting layer, and a circuit line is disposed on the conducting layer. When the second interconnection line layer includes two or more conducting layers, an insulation medium layer is further disposed between neighboring conducting layers. In this case, an aperture is provided through the insulation medium layer to connect circuit lines on different conducting layers.

Figure 7:
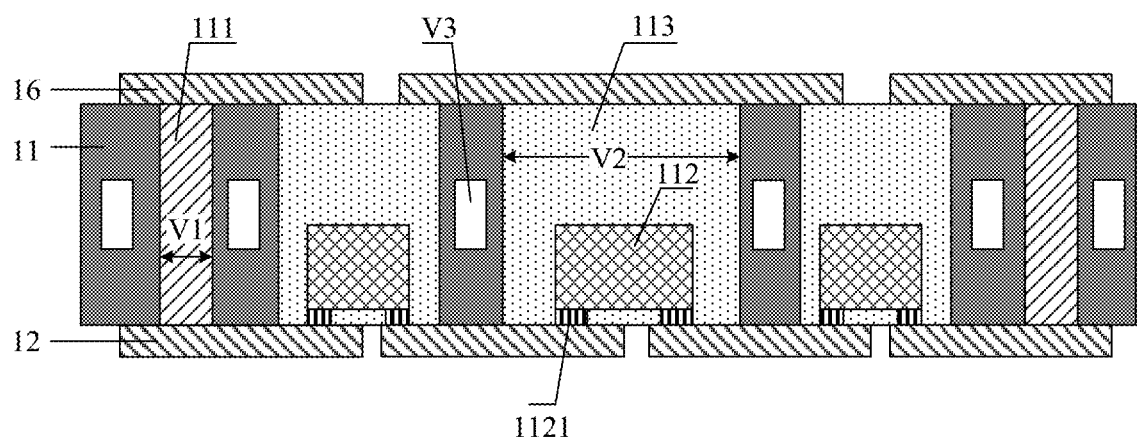
FIG. 7 is a schematic diagram of a structure of an embedded packaging structure according to another embodiment of this application.
Figure 8:
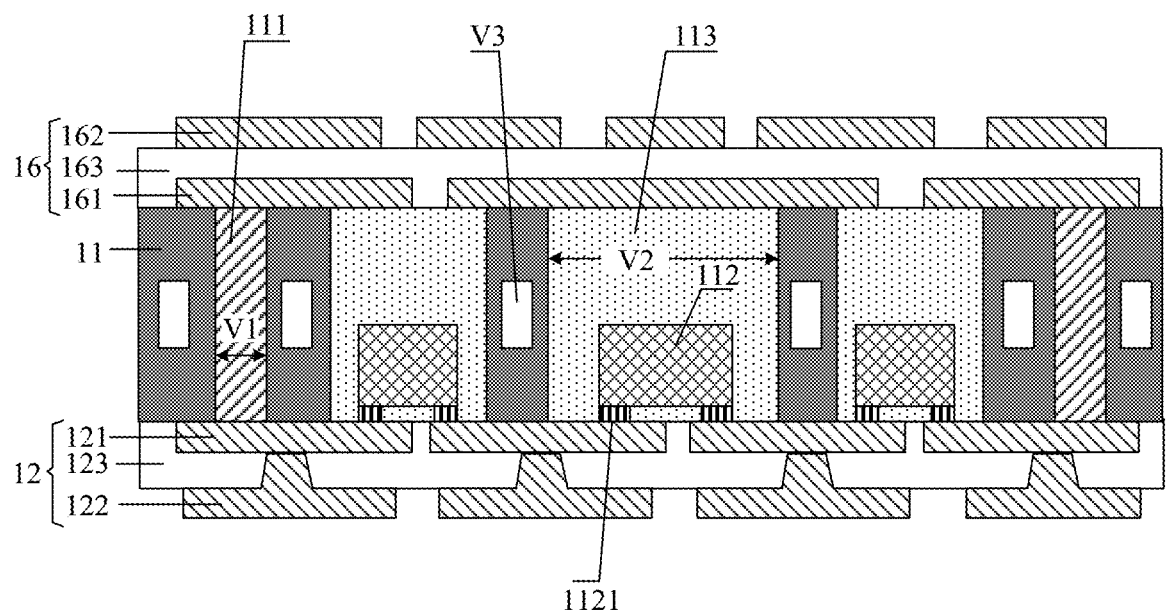
FIG. 8 is a schematic diagram of a structure of an embedded packaging structure according to another embodiment of this application.

For example, as shown in FIG. 7, the second interconnection line layer 16 includes only one conducting layer, and a circuit line on the conducting layer is electrically connected to another terminal of the metal connection electrode 111. Alternatively, as shown in FIG. 8, the second interconnection line layer 16 includes a third conducting layer 161, a fourth conducting layer 162, and an insulation medium layer 163 located between the third conducting layer 161 and the fourth conducting layer 162. A circuit line on the third conducting layer 161 is electrically connected to another terminal of the metal connection electrode 111, and the circuit line on the third conducting layer 161 is electrically connected to the circuit line on a fourth conducting layer 162 through an aperture through the insulation medium layer 163.

It should be noted that a quantity of conducting layers included in the second interconnection line layer is not limited in this application, and may be designed based on an actual requirement. FIG. 7 and FIG. 8 are illustrated only by using an example in which the second interconnection line layer includes one conducting layer or two conducting layers.

Further, after forming the metal connection electrode in the first through hole, and embedding the electronic component in the second through hole, and before forming the second interconnection line layer, the method further includes: forming a second insulation medium layer between the substrate frame and the to-be-formed second interconnection line layer, so that the to-be-formed second interconnection line layer is electrically connected to the other terminal of the metal connection electrode through a via running through the second insulation medium layer.

For example, as shown in FIG. 9 and FIG. 10, the embedded packaging structure 10 may further include: a second insulation medium layer 17 located between the second interconnection line layer 16 and the substrate frame 11, where the second interconnection line layer 16 is electrically connected to the other terminal of the metal connection electrode 111 through a via running through the second insulation medium layer 17. The second insulation medium layer 17 is used as a stress buffer layer, so that a CTE gradient between the second interconnection line layer 16 and the substrate frame 11 decreases, thereby reducing a stress generated when the second interconnection line layer 16 and the substrate frame 11 are interconnected.

It should be noted that a circuit line on the second interconnection line layer 16 closest to a conducting layer of the substrate frame 11 is electrically connected to another terminal of the metal connection electrode 111 through the via running through the second insulation medium layer 17. For example, in FIG. 10, a circuit line on the third conducting layer 161 is electrically connected to another terminal of the metal connection electrode 111 through the via running through the second insulation medium layer 17, and a circuit line on the fourth conducting layer 162 is electrically connected to the circuit line on the third conducting layer 161 through the aperture through the insulation medium layer 163.

Further, in this application, after forming the second interconnection line layer, the method may further include: forming a second solder mask layer on a side of the second interconnection line layer facing away from the substrate frame, where the second solder mask layer is provided with an opening configured to expose a part of an area of the second interconnection line layer; and forming a second pad in the opening of the second solder mask layer, where the second pad is electrically connected to the second interconnection line layer exposed by the opening of the second solder mask layer.

For example, as shown in FIG. 11 to FIG. 14, the embedded packaging structure 10 may further include a second solder mask layer 18 and a plurality of second pads 191. The second solder mask layer 18 is located on a side of the second interconnection line layer 16 facing away from the substrate frame 11, and the second solder mask layer 18 is provided with openings configured to expose a part of an area of the second interconnection line layer 16. The second pads 191 are located in the openings of the second solder mask layer 18, and the second pads 191 are electrically connected to the second interconnection line layer 16 exposed by the openings of the second solder mask layer 18. In this way, the embedded packaging structure 10 and the external component or the substrate are interconnected by using the second pads 191. Positions of the second pads 191 may be re-arranged on the second interconnection line layer 16, to arrange the second pads 191 to an area with a wider pitch. The second solder mask layer 18 may prevent a short circuit between the second pads 191.

In this application, the metal connection electrode located in the first through hole is generally a copper electrode. This is not limited herein.

Optionally, the insulation medium layer may be made of silicon oxide, nitride oxide, epoxy resin, or the like. Materials of insulation medium layers at different positions may be the same or may be different. This is not limited herein.

During actual preparation, the solder mask layer may be a layer structure prepared from a ceramic or high-temperature glass material, and the conducting layer may be a layer structure prepared from any conductive material such as gold, silver, copper, or the like. This is not limited herein.

Figure 14:
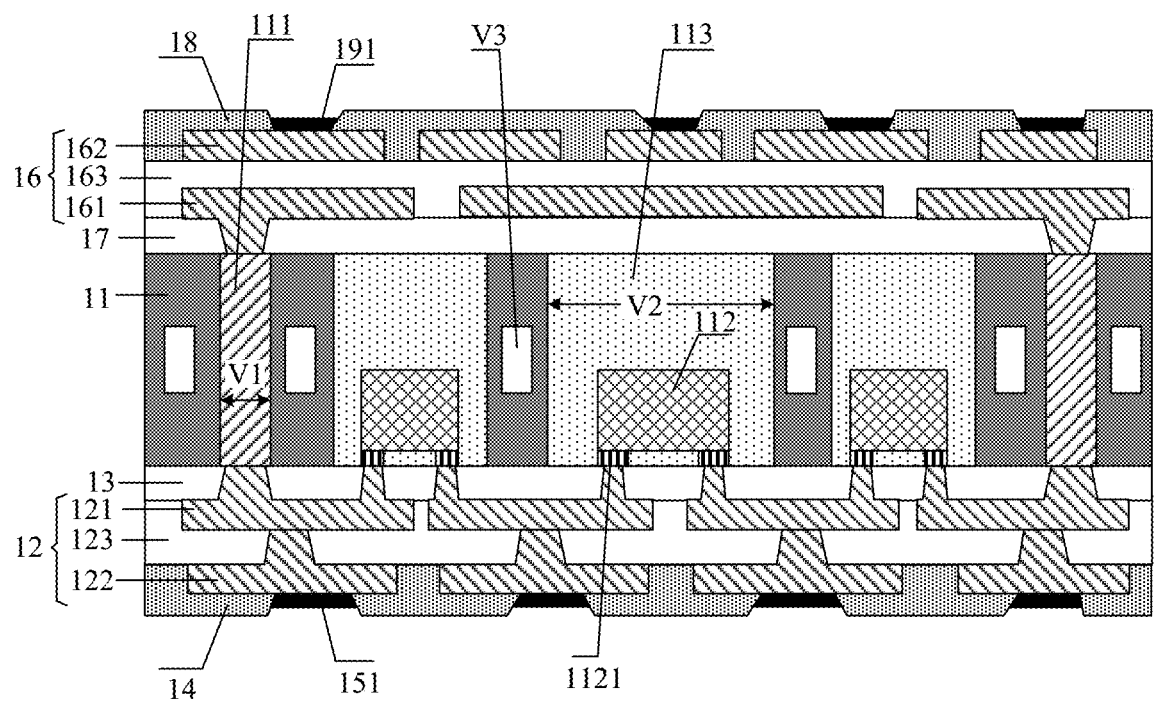
FIG. 14 is a schematic diagram of a structure of an embedded packaging structure according to another embodiment of this application.

It should be noted that a sequence of separately forming the foregoing structures on two sides of the substrate frame 11 is not limited in this application. FIG. 14 is used as an example. Here, the sequence of formation on the upper surface of the substrate frame 11 is: the second insulation medium layer 17, the second interconnection line layer 16, the second solder mask layer 18, and the second pads 191, and the forming sequence on the lower surface of the substrate frame 11 is: the first insulation medium layer 13, the first interconnection line layer 12, the first solder mask layer 14, and the first pads 151. The second insulation medium layer 17, the second interconnection line layer 16, the second solder mask layer 18, and the second pads 191 may be sequentially formed on the upper surface of the substrate frame 11 first; and then, the first insulation medium layer 13, the first interconnection line layer 12, the first solder mask layer 14, and the first pads 151 are sequentially formed on the lower surface of the substrate frame 11. Alternatively, the first insulation medium layer 13, the first interconnection line layer 12, the first solder mask layer 14, and the first pads 151 may be sequentially formed on the lower surface of the substrate frame 11 first; and then, the second insulation medium layer 17, the second interconnection line layer 16, the second solder mask layer 18, and the second pads 191 are sequentially formed on the upper surface of the substrate frame 11. Alternatively, a part of the structure may be formed on the upper surface, or the lower surface, of the substrate frame 11 first; then, a part of the structure is formed on the lower surface, or the upper surface, of the substrate frame 11; and next, another part of structure is formed on the upper surface, or the lower surface, of the substrate frame 11. For example, the second insulation medium layer 17 and the second interconnection line layer 16 may be formed on the upper surface of the substrate frame 11 first; then, the first insulation medium layer 13 and the first interconnection line layer 12 are formed on the lower surface of the substrate frame 11; next, the second solder mask layer 18 and the second pads 191 are formed on the upper surface of the substrate frame 11; and finally, the first solder mask layer 14 and the first pads 151 are formed on the lower surface of the substrate frame 11. Alternatively, for example, the first insulation medium layer 13 and the first interconnection line layer 12 may be formed on the lower surface of the substrate frame 11 first; then, the second insulation medium layer 17 and the second interconnection line layer 16 are formed on the upper surface of the substrate frame 11; next, the first solder mask layer 14 and the first pads 151 are formed on the lower surface of the substrate frame 11; and finally, the second solder mask layer 18 and the second pads 191 are formed on the upper surface of the substrate frame 11.

During specific implementation, in this application, the method may further include: forming a chip unit on one side of the substrate frame. That is, the chip unit and the substrate frame are integrated, so that the embedded packaging structure can be formed integrally by using an existing semiconductor wafer process technology and an existing equipment resource to reduce production costs.

During actual production, the chip unit may be formed before the electronic component is embedded, or the chip unit may be formed after the electronic component is embedded. This is not limited herein.

The chip unit usually refers to the foregoing die, and includes a semiconductor material and a circuit layer arranged on the semiconductor material. A semiconductor component such as a transistor is formed on the semiconductor material. A plurality of layers of circuits are disposed in a circuit layer, and various functional circuits are generally disposed. These circuits are coupled to the semiconductor component on the semiconductor material to form a complete chip circuit structure. A surface on a side on which the circuit layer in the chip is located is referred to as an active surface, and a surface on a side (the other side corresponding to the active surface) on which the semiconductor material in the chip is located is referred to as a passive surface.

Figure 15:
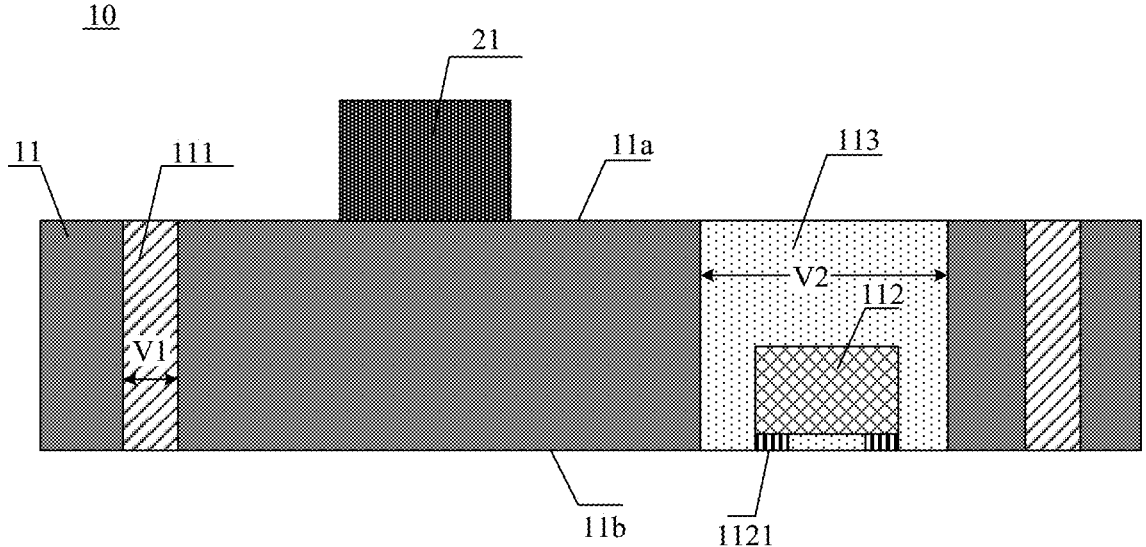
FIG. 15 is a schematic diagram of a structure of an embedded packaging structure according to another embodiment of this application.
Figure 16:
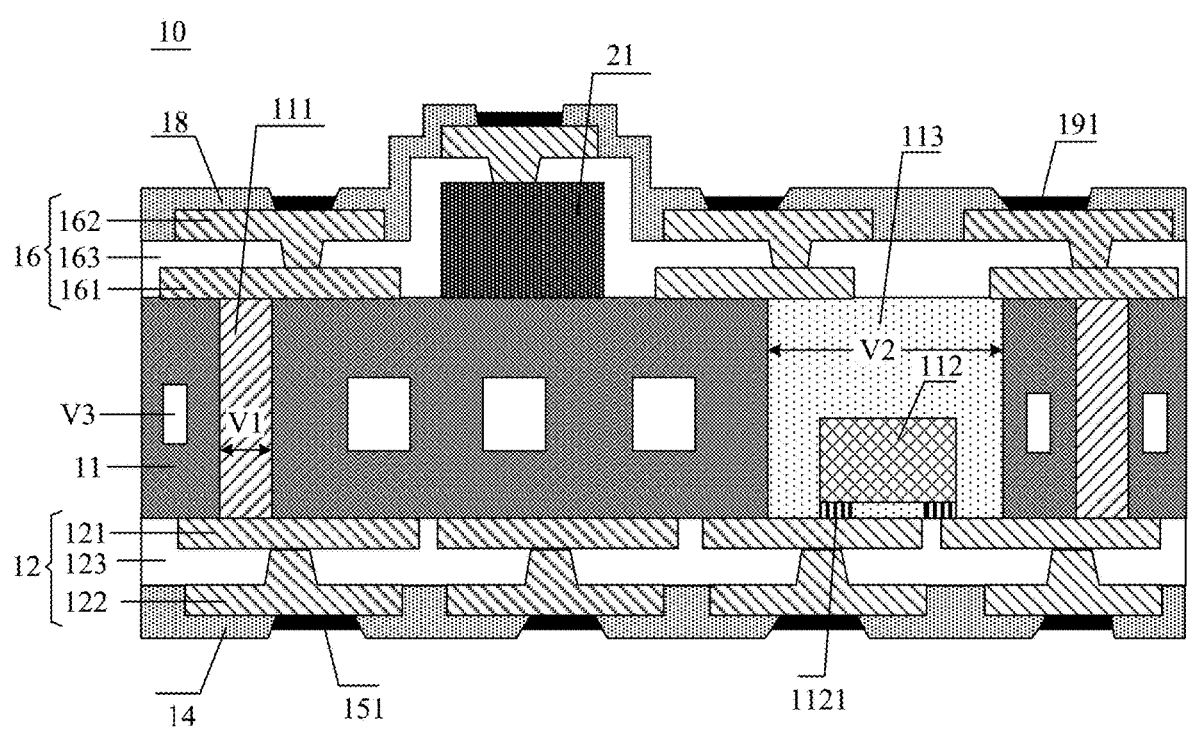
FIG. 16 is a schematic diagram of a structure of an embedded packaging structure according to another embodiment of this application.

In this application, as shown in FIG. 15 and FIG. 16, the chip unit 21 may be located on an upper surface of the substrate frame 11, that is, disposed on a side of the substrate frame 11 facing the first interconnection line layer 12; or may be located on a lower surface of the substrate frame, that is, disposed on a side (not shown in the figure) of the substrate frame 11 facing the second interconnection line layer 16. This is not limited herein. A difference between the chip unit and the embedded die lies in that the substrate frame is reused as a wafer of the chip unit, and the embedded die is formed by cutting after preparation on an additional wafer. The wafer of the embedded die and the substrate frame are not the same wafer.

Any one of the foregoing embedded packaging structures provided in the embodiments of this application may be applied to a terminal device. As shown in FIG. 1, the terminal device may further include a housing 20 and a main board 30 disposed in the housing 20. The embedded packaging structure 10 may be disposed on the main board 30. A problem-resolving principle of the terminal device is similar to that of the foregoing embedded packaging structure. Therefore, for implementation of the terminal device, refer to the implementation of the foregoing embedded packaging structure. Repeated parts are not described again.

The foregoing description is merely a specific implementation of this application, but is not intended to limit the protection scope of this application. Any variation or replacement readily recognized by a person skilled in the art is within the technical scope disclosed in this application shall fall within the protection scope of this application. Therefore, the protection scope of this application shall be subject to the protection scope of the claims.

What is claimed is:

1. An embedded packaging structure, comprising:
   a substrate frame of silicon or a ceramic; and
   a first through hole and a second through hole that run through the substrate frame in a thickness direction of the substrate frame, wherein
   a metal connection electrode is disposed in the first through hole; and
   an electronic component is embedded in the second through hole, and a pin of the electronic component is exposed at a hole opening of the second through hole;
   wherein the substrate frame is further provided with a heat dissipation hole disposed therethrough; and
   an extension direction of the heat dissipation hole is perpendicular to the thickness direction of the substrate frame, and the heat dissipation hole is not in communication with the first through hole or the second through hole.

2. The embedded packaging structure according to claim 1, further comprising:
   a first interconnection line layer located on a side of the substrate frame on which the pin of the electronic component is exposed, wherein the first interconnection line layer is electrically connected to a first terminal end of the metal connection electrode and the pin of the electronic component.

3. The embedded packaging structure according to claim 2, further comprising:
   a first insulation medium layer located between the first interconnection line layer and the substrate frame, wherein the first interconnection line layer is electrically connected to the first terminal end of the metal connection electrode and the pin of the electronic component through a via running through the first insulation medium layer.

4. The embedded packaging structure according to claim 3, further comprising:
   a first solder mask layer located on a side of the first interconnection line layer facing away from the substrate frame, wherein the first solder mask layer is provided with an opening configured to expose a part of an area of the first interconnection line layer; and
   a first pad located in the opening of the first solder mask layer, wherein the first pad is electrically connected to the first interconnection line layer exposed by the opening of the first solder mask layer.

5. The embedded packaging structure according to claim 4, further comprising:
   a second solder mask layer located on a side of a second interconnection line layer facing away from the substrate frame, wherein the second solder mask layer is provided with an opening configured to expose a part of an area of the second interconnection line layer; and
   a second pad located in the opening of the second solder mask layer, wherein the second pad is electrically connected to the second interconnection line layer exposed by the opening of the second solder mask layer.

6. The embedded packaging structure according to claim 3, further comprising:
   a second insulation medium layer located between the second interconnection line layer and the substrate frame, wherein the second interconnection line layer is electrically connected to the second terminal end of the metal connection electrode through a via running through the second insulation medium layer.

7. The embedded packaging structure according to claim 2, further comprising:
   a first solder mask layer located on a side of the first interconnection line layer facing away from the substrate frame, wherein the first solder mask layer is provided with an opening configured to expose a part of an area of the first interconnection line layer; and
   a first pad located in the opening of the first solder mask layer, wherein the first pad is electrically connected to the first interconnection line layer exposed by the opening of the first solder mask layer.

8. The embedded packaging structure according to claim 7, further comprising:
a second solder mask layer located on a side of a second interconnection line layer facing away from the substrate frame, wherein the second solder mask layer is provided with an opening configured to expose a part of an area of the second interconnection line layer; and
a second pad located in the opening of the second solder mask layer, wherein the second pad is electrically connected to the second interconnection line layer exposed by the opening of the second solder mask layer.

9. The embedded packaging structure according to claim 2, further comprising:
a second interconnection line layer located on a side of the substrate frame facing away from the first interconnection line layer, wherein the second interconnection line layer is electrically connected to a second terminal end of the metal connection electrode.

10. The embedded packaging structure according to claim 1, wherein the embedded packaging structure further comprises a chip unit integrated on one side of the substrate frame.

11. A terminal device, comprising:
a housing and a main board disposed in the housing; and
an embedded packaging structure, wherein the embedded packaging structure comprises a substrate frame, wherein the substrate frame is made of silicon or a ceramic, and
a first through hole and a second through hole that run through the substrate frame in a thickness direction of the substrate frame, wherein
a metal connection electrode is disposed in the first through hole, and
an electronic component is embedded in the second through hole, and a pin of the electronic component is exposed at a hole opening of the second through hole;
wherein the substrate frame is further provided with a heat dissipation hole disposed therethrough; and
an extension direction of the heat dissipation hole is perpendicular to the thickness direction of the substrate frame, and the heat dissipation hole is not in communication with the first through hole or the second through hole.

12. The terminal device according to claim 11, further comprising:
a first interconnection line layer located on a side of the substrate frame on which the pin of the electronic component is exposed, wherein the first interconnection line layer is electrically connected to a first terminal end of the metal connection electrode and the pin of the electronic component.

13. The terminal device according to claim 12, further comprising:
a first insulation medium layer located between the first interconnection line layer and the substrate frame, wherein the first interconnection line layer is electrically connected to the first terminal end of the metal connection electrode and the pin of the electronic component through a via running through the first insulation medium layer.

14. The terminal device according to claim 12, further comprising:
a first solder mask layer located on a side of the first interconnection line layer facing away from the substrate frame, wherein the first solder mask layer is provided with an opening configured to expose a part of an area of the first interconnection line layer; and
a first pad located in the opening of the first solder mask layer, wherein the first pad is electrically connected to the first interconnection line layer exposed by the opening of the first solder mask layer.

* * * * *